United States Patent
Vanderleest et al.

(10) Patent No.: US 7,825,721 B2
(45) Date of Patent: Nov. 2, 2010

(54) SYSTEMS AND METHODS FOR FILTERING SIGNALS CORRESPONDING TO SENSED PARAMETERS

(75) Inventors: Ruurd A. Vanderleest, Vernon, CT (US); Brett Marples, Yorktown Heights, NY (US)

(73) Assignee: United Technologies Corp., Hartford, CT (US)

( * ) Notice: Subject to any disclaimer, the term of this patent is extended or adjusted under 35 U.S.C. 154(b) by 67 days.

(21) Appl. No.: 12/253,329

(22) Filed: Oct. 17, 2008

(65) Prior Publication Data

US 2010/0097132 A1     Apr. 22, 2010

(51) Int. Cl.
*H03B 1/00* (2006.01)
*H03K 5/00* (2006.01)
*H04B 1/10* (2006.01)

(52) U.S. Cl. ........................ 327/551; 327/552

(58) Field of Classification Search ............ 327/551
See application file for complete search history.

(56) References Cited

U.S. PATENT DOCUMENTS

| | | | |
|---|---|---|---|
| 5,566,092 A | 10/1996 | Wang et al. | |
| 5,764,524 A * | 6/1998 | Andersson et al. | ............ 702/79 |
| 6,073,262 A | 6/2000 | Larkin et al. | |
| 6,144,924 A | 11/2000 | Dowling et al. | |
| 6,308,140 B1 | 10/2001 | Dowling et al. | |
| 6,347,289 B1 | 2/2002 | VanderLeest | |
| 6,623,089 B2 | 9/2003 | Amberkar | |
| 7,130,772 B2 | 10/2006 | Burnet et al. | |
| 7,152,942 B2 | 12/2006 | Walmsley et al. | |
| 7,197,147 B2 | 3/2007 | Millott et al. | |
| 7,291,112 B2 | 11/2007 | Martin et al. | |

* cited by examiner

*Primary Examiner*—Lincoln Donovan
*Assistant Examiner*—Daniel Rojas
(74) *Attorney, Agent, or Firm*—Carlson, Gaskey & Olds, P.C.

(57) ABSTRACT

Systems and methods for filtering analog signals corresponding to sensed parameters are provided. In this regard, a representative method includes: sampling the analog signal to acquire a sequential series of data points; determining a first cumulative change in value with respect to a first of the data points relative to at least two subsequent data points in the series, the subsequent data points including a second of the data points; determining a second cumulative change in value with respect to the second of the data points relative to at least two data points adjacent to the second of the data points in the series, the at least two adjacent data points including an immediately preceding and an immediately succeeding one of the data points relative to the second of the data points; comparing the first cumulative change and the second cumulative change to respective data thresholds; and outputting a filtered analog signal based, at least in part, on results of the comparing.

20 Claims, 4 Drawing Sheets

SYSTEMS AND METHODS FOR FILTERING SIGNALS CORRESPONDING TO SENSED PARAMETERS

BACKGROUND

1. Technical Field

The disclosure generally relates to signal processing.

2. Description of the Related Art

Analog signals are used in numerous applications, such as carrying information acquired by sensors. Unfortunately, noise also typically accompanies the information. Depending upon the application and the associated characteristics of the information (e.g., relatively steady state), noise can be removed relatively effectively. In some applications, however, the removal of noise from a signal can be more problematic.

SUMMARY

Systems and methods for filtering signals corresponding to sensed parameters are provided. In this regard, an exemplary embodiment of a method for filtering an analog signal corresponding to a sensed parameter comprises: sampling the analog signal; determining a first cumulative change in value of the parameter with respect to consecutively sensed pairs of samples of the parameter, a first of the pairs of the samples comprising, in time-sampled order, a first previous value and a second previous value, a second of the pairs of the samples comprising the first previous value and a current value; determining a second cumulative change in value of the parameter with respect to the first of the pairs of the samples and a third of the pairs of the samples, the third of the pairs of samples comprising the second previous value and the current value; and outputting a filtered analog signal corresponding to the sensed parameter, an analog value being carried by the filtered analog signal being selected based, at least in part, on comparison of the first cumulative change and the second cumulative change to respective predetermined out-of-bound limits such that, responsive to at least one of the first cumulative change and the second cumulative change being outside the respective predetermined out-of-bounds limits, the information being carried by the filtered analog signal is maintained at a previous analog value.

Another exemplary embodiment of a method for filtering an analog signal corresponding to a sensed parameter comprises: sampling the analog signal to acquire a sequential series of data points; determining a first cumulative change in value with respect to a first of the data points relative to at least two subsequent data points in the series, the subsequent data points including a second of the data points; determining a second cumulative change in value with respect to the second of the data points relative to at least two data points adjacent to the second of the data points in the series, the at least two adjacent data points including an immediately preceding and an immediately succeeding one of the data points relative to the second of the data points;

comparing the first cumulative change and the second cumulative change to respective data thresholds; and outputting a filtered analog signal based, at least in part, on results of the comparing.

An exemplary embodiment of a system for filtering an analog signal corresponding to a parameter comprises: a signal processor operative to: receive information corresponding to samples of the analog signal; determine a first cumulative change in value of the parameter with respect to consecutive pairs of the samples of the parameter, a first of the pairs of the samples comprising, in time-sampled order, a first previous value and a second previous value, a second of the pairs of the samples comprising the first previous value and a current value; determine a second cumulative change in value of the parameter with respect to the first of the pairs of the samples and a third of the pairs of the samples, the third of the pairs of samples comprising the second previous value and the current value; and control output of a filtered analog signal corresponding to the parameter, an analog value being carried by the filtered analog signal being selected based, at least in part, on comparison of the first cumulative change and the second cumulative change to respective predetermined out-of-bound limits such that, responsive to at least one of the first cumulative change and the second cumulative change being outside the respective predetermined out-of-bounds limits, the information being carried by the filtered analog signal is maintained at a previous analog value.

Other systems, methods, features and/or advantages of this disclosure will be or may become apparent to one with skill in the art upon examination of the following drawings and detailed description. It is intended that all such additional systems, methods, features and/or advantages be included within this description and be within the scope of the present disclosure.

BRIEF DESCRIPTION OF THE DRAWINGS

Many aspects of the disclosure can be better understood with reference to the following drawings. The components in the drawings are not necessarily to scale. Moreover, in the drawings, like reference numerals designate corresponding parts throughout the several views.

DETAILED DESCRIPTION

Systems and methods for filtering analog signals corresponding to sensed parameters are provided, several exemplary embodiments of which will be described in detail. In this regard, analog signals can be filtered by identifying aspects of the signal related to noise and then either allowing a time-delayed value of the signal to propagate or maintaining propagation of a known acceptable value for the signal depending upon the severity of the noise. In some embodiments, cumulative deviations of signal values can be calculated relative to previous signal values to generate dynamic criterion against which future signal values are evaluated. In some embodiments, the computed deviations are evaluated with respect to multiple thresholds, the failure of one or more of the computed deviations to comply with respective ones of the thresholds resulting in a filtered analog signal being maintained at a previous value.

Figure 1:
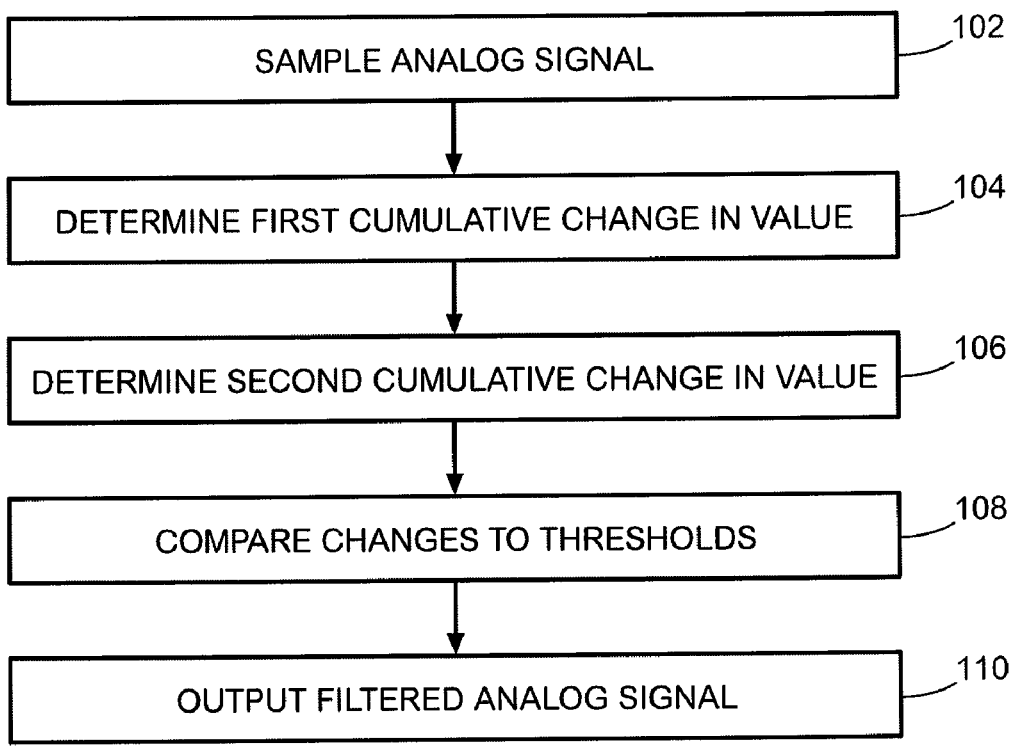
FIG. 1 is a flowchart depicting an exemplary embodiment of a method for filtering an analog signal corresponding to a sensed parameter.

In this regard, reference is made to the flowchart of FIG. 1, which depicts an exemplary embodiment of a method for filtering an analog signal corresponding to a sensed parameter. As shown in FIG. 1, the method may be construed as beginning at block 102, in which the analog signal is sampled to acquire a sequential series of data points. In block 104, a first cumulative change in value with respect to a first of the data points relative to at least two subsequent data points in the series is determined. Notably, the subsequent data points include a second of the data points. In block 106, a second cumulative change in value with respect to the second of the data points relative to at least two adjacent data points in the series is determined. Specifically, the adjacent data points include a data point immediately preceding the second data point and a data point immediately succeeding the second data point. Then, as depicted in block 108, the first cumulative change and the second cumulative change are compared to respective data thresholds. In block 110, a filtered analog signal is output based, at least in part, on results of the comparing the cumulative changes to the data thresholds.

Figure 2:
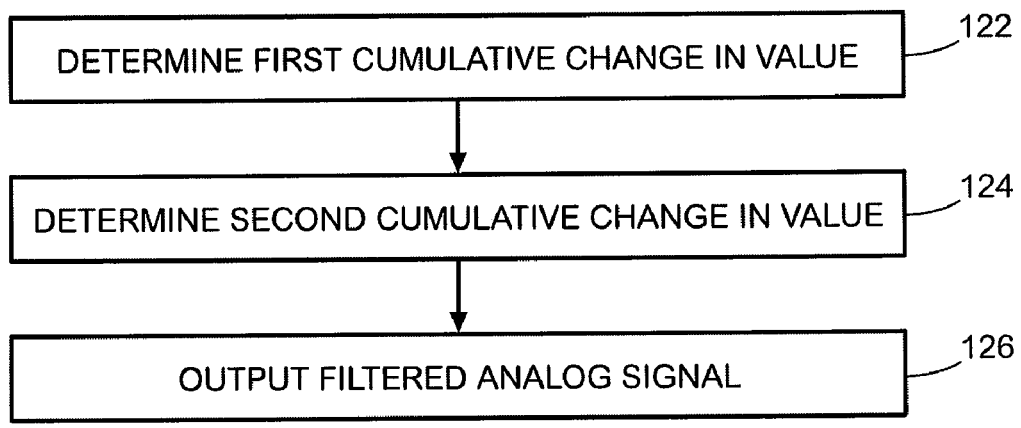
FIG. 2 is a flowchart depicting another exemplary embodiment of a method for filtering an analog signal corresponding to a sensed parameter.

FIG. 2 is a flowchart depicting another exemplary embodiment of a method for filtering an analog signal corresponding to a sensed parameter. As shown in FIG. 2, the method may be construed as beginning at block 122, in which a first cumulative change in value with respect to consecutively sensed pairs of samples is determined. In some embodiments, a first of the pairs includes a first previous value ($A_{T_{z-1}}$) and a second previous value ($A_{T_{z-2}}$), and a second of the pairs includes the first previous value ($A_{T_{z-1}}$) and a current value ($A_T$). It should be noted that, in some of these embodiments, the first previous value ($A_{T_{z-1}}$) corresponds to the first of the data points described above (FIG. 1), whereas the second previous value ($A_{T_{z-2}}$) corresponds to the immediately preceding data point and the current value ($A_T$) corresponds to the immediately succeeding data point. For instance, in order to determine a first cumulative change in value, the following formula (which can be referred to as an excursion formula) can be used:

$$|(A_{T_{z-1}}-A_{T_{z-2}})+(A_{T_{z-1}}-A_T)|.$$

In block 124, a second cumulative change in value with respect to the first of the pairs and a third of the pairs is determined. By way of example, the third of the pairs can include the second previous value ($A_{T_{z-2}}$) and the current value ($A_T$). Continuing with the same example above, the following formula (which can be referred to as a distance formula) can be used for determining a second cumulative change in value:

$$|(A_{T_{z-2}}-A_{T_{z-1}})+(A_{T_{z-2}}"A_T)|.$$

In block 126, a filtered analog signal corresponding to the sensed parameter is output. In some embodiments, the analog value being carried by the filtered analog signal is selected based, at least in part, on comparisons of the first cumulative change and the second cumulative change to respective predetermined thresholds, (e.g., out-of-bounds and/or in-bounds limits).

Figure 3:
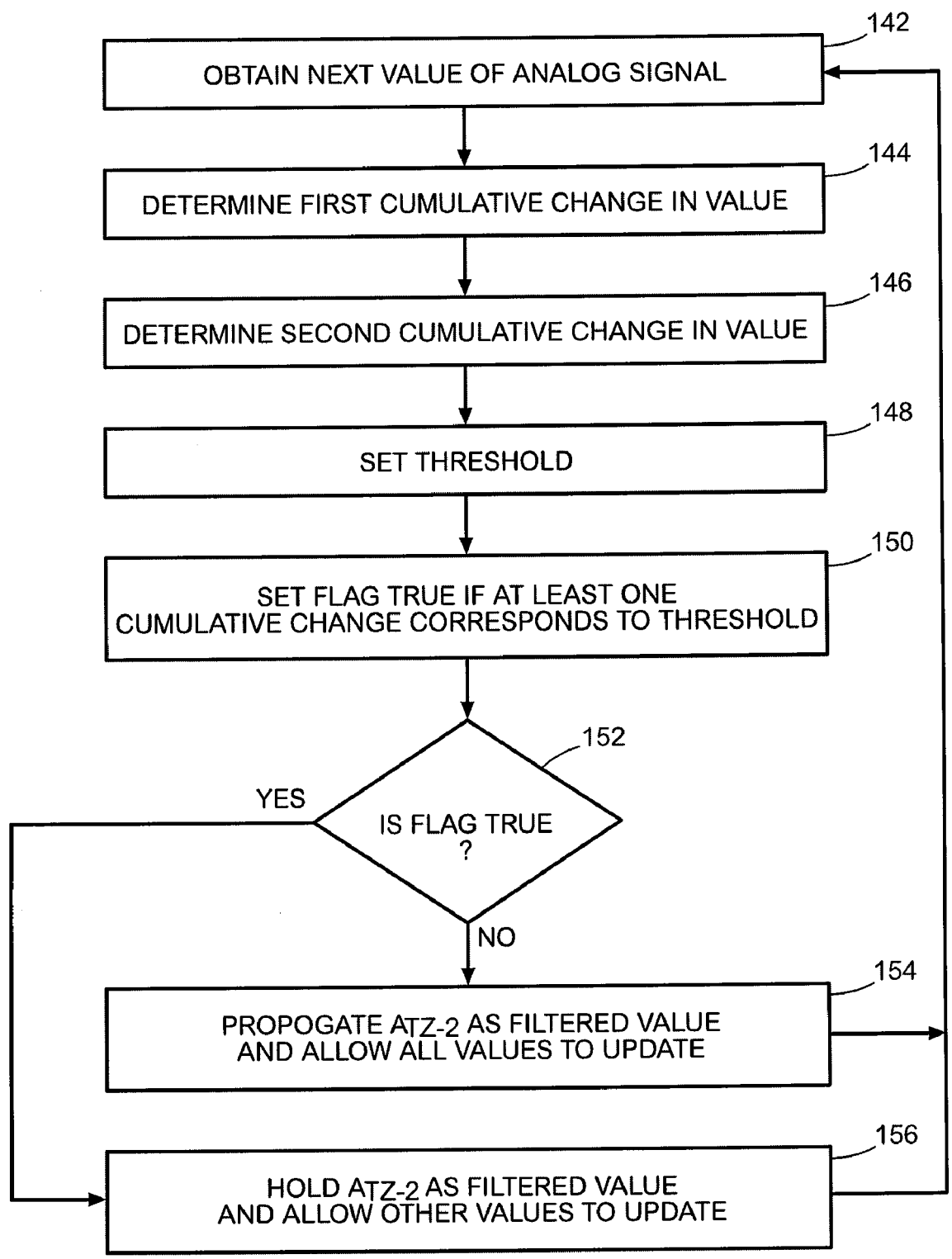
FIG. 3 is a flowchart depicting another exemplary embodiment of a method for filtering an analog signal corresponding to a sensed parameter.

FIG. 3 is a flowchart depicting another exemplary embodiment of a method for filtering an analog signal corresponding to a sensed parameter. As shown in FIG. 3, the method may be construed as beginning at block 142, in which a next sample of an analog signal is obtained. Notably, the next sample contains information ($A_T$). In block 144, an excursion formula is used to determine a first cumulative change in value of the information with respect to other samples of the analog signal. In block 146, a distance formula is used to determine a second cumulative change in value of the information with respect to other samples of the analog signal.

As shown in block 148, a flag threshold is set to either a FLAG IN value or a FLAG OUT value. In this regard, the flag threshold is used in evaluating the results of the excursion and distance formulas to determine whether the current sample ($A_T$) is within the desired predetermined limits. Notably, the FLAG IN value and FLAG OUT value can be set based on one or more of a variety of factors. For instance, the analog steady state value for FLAG OUT, and how close the analog value should return to the original value for FLAG IN can be used. It should be noted that in this embodiment, the FLAG IN value is more restrictive than that of the FLAG OUT value. That is, the FLAG IN value is closer to the value of a non-noisy signal. Thus, once the signal is considered out-of-bounds and set to TRUE (e.g., the value exceeds the FLAG OUT value), the sample value must return to a value closer to the value of the non-noisy signal before the flag is reset to FALSE. In this way, the value of FLAG IN is less than or equal to FLAG OUT.

In block 150, the flag is set TRUE if either or both of the values determined by the excursion and distances formulas correspond to the flag threshold; otherwise, the flag is set to FALSE. Proceeding to block 152, a determination is made as to whether the flag is set to TRUE or to FALSE. If the flag is set to FALSE, the process proceeds to block 154, in which a value of $A_{T-2}$ is propagated as the output value of the filtered analog signal. Additionally, a next sample iteration advances the sample values. That is, $A_{T-2}$ is reset with the value of $A_{T-1}$, $A_{T-1}$ is reset with the value of $A_T$, and the process returns to block 142 to acquire a next value of $A_T$.

However, if it is determined in block 152 that the flag is set TRUE, a previous output value of the filtered analog signal is enabled to propagate. By way of example, in an embodiment in which signal processing involves a two time interval delay, the value associated with sample $A_{T-2}$ can be propagated again. Thus, in contrast to advancing all of the sample values, the value of $A_{T-2}$ is maintained (i.e., held as $A_{T-2}$), $A_{T-1}$ is reset with the value of $A_T$, and the process returns to block 142 to acquire a next value of $A_T$.

Since $A_{T-2}$ is initially used as the filtered signal, the excursion and distance formulas rely on two past signals as validation. Should a FLAG indicate an errant signal, the $A_{T-2}$ filtered signal is held continuously as both the filtered signal and the value of $A_{T-2}$ in the excursion and distance formulas. In this way, once the flag is set FALSE, the held value is used as the filtered signal after a two time interval delay.

Figure 4:
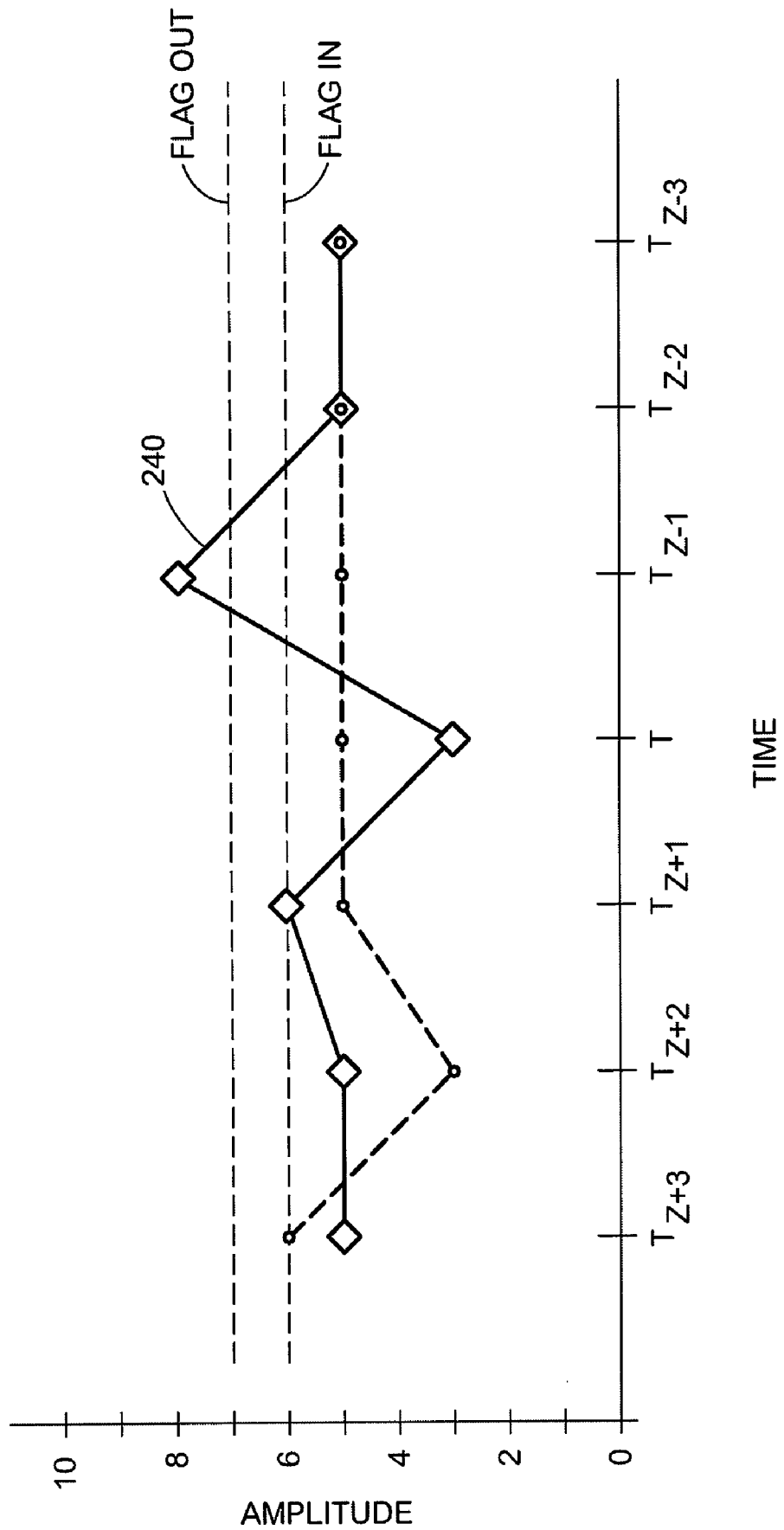
FIG. 4 is a graph depicting a representative analog signal with a corresponding filtered analog signal related to an exemplary embodiment of a method.

FIG. 4 is a graph depicting a representative analog signal and corresponding excursion formula values related to an exemplary embodiment of a method, in which flag threshold values of 7 (flag out) and 6 (flag in) are used (both of which are depicted in dashed lines). Specifically, the graph of FIG. 4 depicts an analog signal 240, with values of the signal occurring at designated time intervals (e.g., time $T_{z+1}$) corresponding to samples or data points of the analog signal (shown as diamonds) as may be received by a signal processor for filtering. Using data points T, $T_{z-1}$, $T_{z-2}$ and $T_{z-3}$ as examples, the exemplary excursion formula described above with respect to FIG. 3 results in the following at time $T_{z-1}$:

$$|(5-5)+(5-8)|=3,$$

and the exemplary distance formula results in:

$$|(5-5)+(5-8)|=3.$$

Since the flag threshold is currently set to the value of flag out (i.e., 7) at time $T_{z-1}$, the flag remains set as FALSE and the value of $A_{T_{z-2}}$ (i.e., 5) is enabled to propagate as the filtered analog signal. The filtered analog signal output is depicted by a short dashed line between output data points represented by circles. Additionally, a next sample iteration advances the sample values to values associated with time T.

At time T, the exemplary excursion formula results in the following:

$$|(8-5)+(8-3)|=8,$$

and the exemplary distance formula results in:

$$|(5-8)+(5-3)|=1.$$

Since the flag threshold is currently set to the value of flag out (i.e., 7) at time T, the flag is set to TRUE. This results in the previous value of $A_{T_{z-2}}$ (i.e., now $A_{T_{z-3}}$=5) being propagated as the filtered analog signal. Additionally, a next sample iteration advances the sample values to values associated with time $T_{z+1}$, with the exception of $A_{T_{z-2}}$, which does not advance (i.e., the value of $A_{T_{z-2}}$ is held=5). The flag threshold also is set to the flag in value of 6. Note here that $A_{T_{z-2}}$ used in the exemplary formulas is the propagated filtered signal of value of 5, not 8.

At time $T_{z+1}$, the exemplary excursion formula results in the following:

$$|(3-5)+(3-6)|=5,$$

and the exemplary distance formula results in:

$$|(5-3)+(5-6)|=1.$$

Since the flag threshold is currently set to the value of flag in (i.e., 6) at time $T_{z+1}$, and neither nor both of the formulas results in a value corresponding to the flag threshold, the flag is reset to FALSE and the value of $A_T$ (i.e., 6) is enabled to propagate as the filtered analog signal. Additionally, a next sample iteration advances the sample values to values associated with time $T_{z+2}$.

Figure 5:
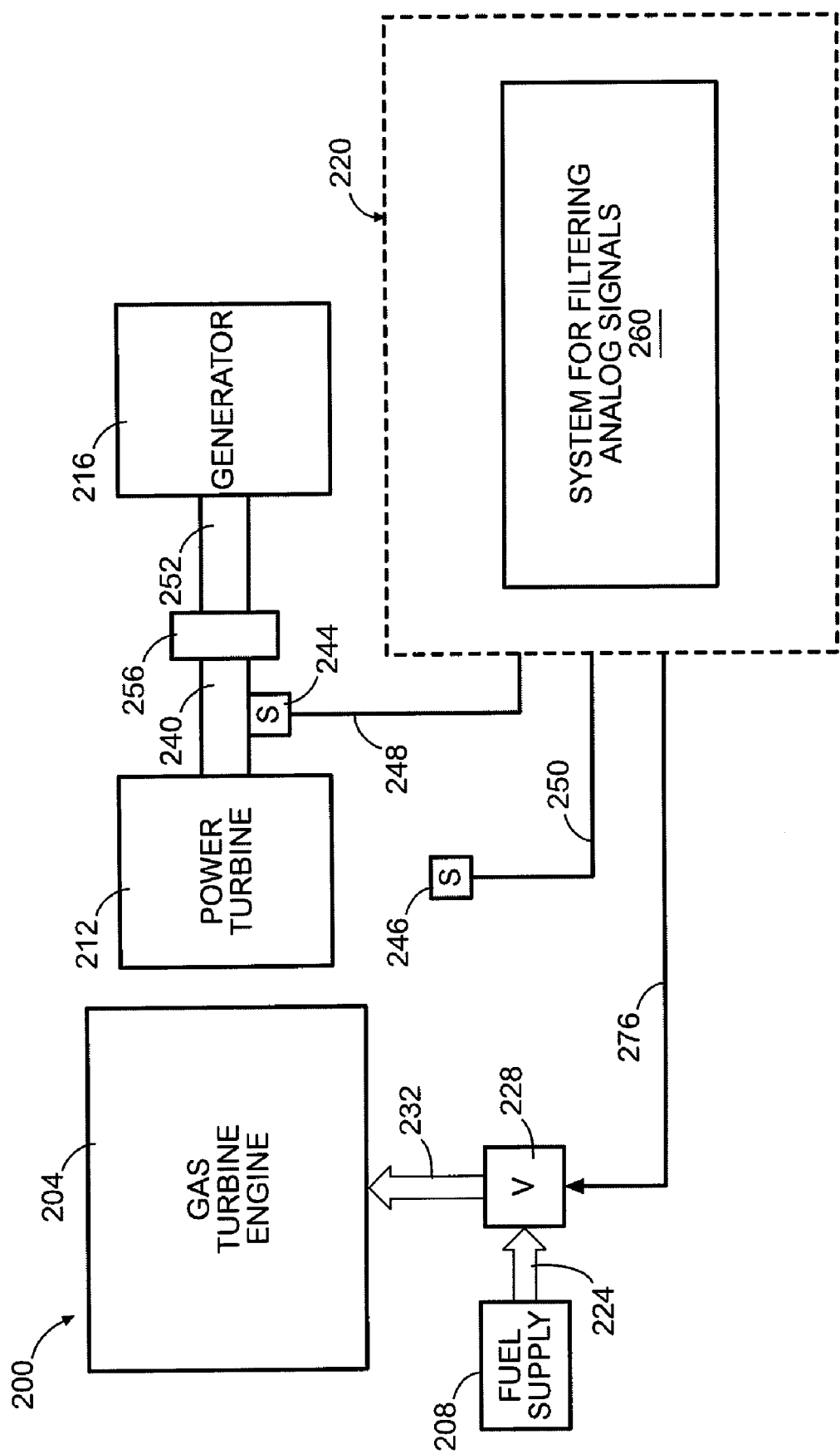
FIG. 5 is a schematic diagram depicting an exemplary embodiment of a gas turbine power plant.

FIG. 5 is a schematic diagram depicting an exemplary embodiment of an industrial gas turbine power plant, which is a representative system for implementing an embodiment of a method for filtering analog signals. As shown in FIG. 5, power plant 200 a gas turbine engine 204, a fuel supply 208, a power turbine 212, a generator 216, and an engine control system 220. Although its detailed components are not illustrated in detail herein, a gas turbine engine 204 includes a low pressure rotor with a low pressure compressor directly connected by a first shaft to a downstream low pressure turbine. The low-pressure compressor receives air from the engine inlet. The gas turbine engine 204 also has a high-pressure rotor located between the low-pressure compressor and the low-pressure turbine. The high-pressure rotor includes a high-pressure compressor directly connected by a second shaft to a downstream high-pressure turbine. The second shaft extends through the first shaft, which is partially hollow.

Gas turbine engine 204 also includes a burner located between the high-pressure compressor and the high-pressure turbine. The burner includes combustors that surround the rotor shafts. The burner receives compressed air from the compressors and fuel from the fuel supply 208 and ignites the fuel/air mixture to create exhaust air that enters the two turbines. The fuel supply 208 provides fuel into a first fuel supply line 224, through a fuel valve 228, and then into a second fuel supply line 232 to the burner. The fuel valve 228, including its associated actuator, are under the control of a system for filtering analog signals 260 (which can include a signal processor) located within the control system 220, as described hereinafter. The fuel valve 228 facilitates the modulation of the fuel supplied to the burner.

The gas turbine power plant 200 further includes the power turbine 212 located downstream of the gas turbine engine 204. The power turbine 212 has a rotatable shaft 240. The turbine shaft 240 may have a number of physical protrusions such as teeth (not shown) formed as an integral part of the shaft 240. In the embodiment of FIG. 5, the turbine shaft 240 has a speed sensor 244 attached thereto. The speed sensor 244 senses the rotational motion of the physical protrusions on the turbine shaft 240. The speed sensor 244 senses a corresponding parameter (in this case, the rotational speed of the turbine shaft 240 and provides a signal indicative thereof on a signal line 248 to the control system 220. Similarly, a temperature sensor 246 provides a signal indicative of ambient air temperature on a signal line 250 to the control system 220.

The gas turbine power plant 200 also has the generator 216 coupled by a rotatable shaft 252 to the power turbine shaft 240 by a coupling 256. The coupling 256 adapts the turbine shaft 240 to fixedly engage the generator shaft 252. Thus, the speed signal on the line 248 is also indicative of the rotational speed of the generator shaft 252.

Note that the power turbine 212 is physically disconnected from the gas turbine engine 204. As such, the jet exhaust air exiting the two turbines of the gas turbine engine 204 flows through the power turbine 212, thereby driving the power turbine 212 and producing mechanical energy. The mechanical energy is in the form of the rotation of both the power turbine shaft 240 and the coupled generator shaft 252. The generator 216 converts this mechanical energy into electrical energy.

Engine control 220 receives the speed signal on the line 248 from the speed sensor 244 and a temperature signal on line 250 from sensor 246. The engine control 220 includes a system for filtering analog signals 260. Filtered analog signals provided by the system 260 are used by the engine control 220, via a signal on the line 276, to control the fuel valve 228 during modulation of the fuel flow to the burner.

In operation, inlet air flows through the compressors of the gas turbine engine 204. The resulting compressed air flows to the burner. The fuel supply 208 provides fuel to the burner. The burner ignites the fuel/air mixture in the combustors, causing jet exhaust air to be created at the burner outlet. The jet exhaust air flows downstream and passes through the two turbines, thereby driving the first and second rotor shafts. The rotation of these shafts, in turn, causes the two compressors upstream to rotate. The rotation of the compressors supplies the burner with the necessary inlet air.

After the jet exhaust air passes through the two turbines, the exhaust air flows through the power turbine 212 and out the gas turbine engine 204. The jet exhaust air drives the power turbine 212 by rotating the turbine shaft 240. The generator shaft 252 is also rotated by the power turbine shaft 240 through the coupling 256. The speed sensor 244 senses the rotational speed of the power turbine shaft 240 and, thus, the generator shaft 252 as well, and provides the speed signal on the line 248 to the system 260 within the engine control 220. The system 260 receives the sensed speed signal and the temperature signal on line 250 and then performs an analog filtering process such as described above with respect to the exemplary embodiments of FIGS. 1-3.

Various functionality, such as that described above in the flowcharts, can be implemented in hardware and/or software. In this regard, a computing device can be used to implement various functionality, such as that performed by the system for filtering analog signals 260.

In terms of hardware architecture, such a computing device can include a processor, memory, and one or more input and/or output (I/O) device interface(s) that are communicatively coupled via a local interface. The local interface can include, for example but not limited to, one or more buses and/or other wired or wireless connections. The local interface may have additional elements, which are omitted for simplicity, such as controllers, buffers (caches), drivers, repeaters, and receivers to enable communications. Further, the local interface may include address, control, and/or data connections to enable appropriate communications among the aforementioned components.

The processor may be a hardware device for executing software, particularly software stored in memory. The processor can be a custom made or commercially available processor, a central processing unit (CPU), an auxiliary processor among several processors associated with the computing device, a semiconductor based microprocessor (in the form of a microchip or chip set) or generally any device for executing software instructions.

The memory can include any one or combination of volatile memory elements (e.g., random access memory (RAM, such as DRAM, SRAM, SDRAM, VRAM, etc.)) and/or non-volatile memory elements (e.g., ROM, hard drive, tape, CD-ROM, etc.). Moreover, the memory may incorporate electronic, magnetic, optical, and/or other types of storage media. Note that the memory can also have a distributed architecture, where various components are situated remotely from one another, but can be accessed by the processor.

The software in the memory may include one or more separate programs, each of which includes an ordered listing of executable instructions for implementing logical functions. A system component embodied as software may also be construed as a source program, executable program (object code), script, or any other entity comprising a set of instructions to be performed. When constructed as a source program, the program is translated via a compiler, assembler, interpreter, or the like, which may or may not be included within the memory.

The Input/Output devices that may be coupled to system I/O Interface(s) may include input devices, for example but not limited to, a keyboard, mouse, scanner, microphone, camera, proximity device, etc. Further, the Input/Output devices may also include output devices, for example but not limited to, a printer, display, etc. Finally, the Input/Output devices may further include devices that communicate both as inputs and outputs, for instance but not limited to, a modulator/demodulator (modem; for accessing another device, system, or network), a radio frequency (RF) or other transceiver, a telephonic interface, a bridge, a router, etc.

When the computing device is in operation, the processor can be configured to execute software stored within the memory, to communicate data to and from the memory, and to generally control operations of the computing device pursuant to the software. Software in memory, in whole or in part, is read by the processor, perhaps buffered within the processor, and then executed.

One should note that the flowcharts included herein show the architecture, functionality, and operation of a possible implementation of software. In this regard, each block can be interpreted to represent a module, segment, or portion of code, which comprises one or more executable instructions for implementing the specified logical function(s). It should also be noted that in some alternative implementations, the functions noted in the blocks may occur out of the order and/or not at all. For example, two blocks shown in succession may in fact be executed substantially concurrently or the blocks may sometimes be executed in the reverse order, depending upon the functionality involved.

One should note that any of the functionality described herein can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" contains, stores, communicates, propagates and/or transports the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of a computer-readable medium include a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical).

It should be emphasized that the above-described embodiments are merely possible examples of implementations set forth for a clear understanding of the principles of this disclosure. Many variations and modifications may be made to the above-described embodiments without departing substantially from the spirit and principles of the disclosure. All such modifications and variations are intended to be included herein within the scope of this disclosure and protected by the accompanying claims.

The invention claimed is:

1. A method for filtering a signal corresponding to a sensed parameter comprising:

a controller determining a first cumulative change in value of the parameter with respect to consecutively sensed pairs of samples of the parameter, a first of the pairs of the samples comprising, in time-sampled order, a first previous value and a second, previous value, a second of the pairs of the samples comprising the first previous value and a current value;

said controller determining a second cumulative change in value of the parameter with respect to the first of the pairs of the samples and a third of the pairs of the samples, the third of the pairs of samples comprising the second previous value and the current value;

said controller outputting a filtered signal, the filtered signal containing information corresponding to the second previous value if the first cumulative change and the second cumulative change are within respective predetermined out-of-bounds limits;

said controller maintaining output of the filtered signal with the information corresponding to the second previous value if at least one of the first cumulative change and the second cumulative change is not within the respective predetermined out-of-bounds limits; and said controller modifying the output of the filtered signal such that the filtered signal contains information corresponding to a subsequent second previous value if a corresponding subsequent first cumulative change and a corresponding subsequent second cumulative change are within respective predetermined in-bounds limits, the in-bounds limits being more restrictive than the out-of-bounds limits.

2. The method of claim 1, wherein the out-of-bounds limits are dynamically set.

3. The method of claim 2, wherein the in-bounds limits are dynamically set.

4. The method of claim 1, further comprising said controller sampling an analog signal to obtain the samples of the parameter.

5. The method of claim 1, wherein the filtered signal is an analog signal.

6. The method of claim 1, wherein the first previous value immediately precedes the current value in the time-sampled order.

7. The method of claim 6, wherein the second previous value immediately precedes the first previous value in the time-sampled order.

8. The method of claim 1, further comprising said controller iteratively performing the steps of determining the first cumulative change, determining the second cumulative change and outputting the filtered signal with respect to subsequently sensed samples of the parameter such that, at a next iteration, the second previous value is replaced by the first previous value, the first previous value is replaced by the current value, and the current value is replaced by a next current value.

9. The method of claim 1, wherein determining the first cumulative change in value comprises:
   subtracting the second previous value from the first previous value to generate a first difference;
   subtracting the current value from the first previous value to generate a second difference;
   adding the first difference and the second difference to generate a first sum; and
   computing the absolute value of the first sum.

10. The method of claim 1, wherein the parameter is a temperature.

11. The method of claim 1, wherein the parameter is associated with a speed of a device.

12. The method of claim 11, wherein:
   the device is a gas turbine engine; and
   the speed is a rotational speed of a portion of the gas turbine engine.

13. A method for filtering an analog signal corresponding to a sensed parameter comprising:
   a controller sampling the analog signal to acquire a sequential series of data points;
   said controller determining a first cumulative change in value with respect to a first of the data points relative to at least two subsequent data points in the series, the subsequent data points including a second of the data points;
   said controller determining a second cumulative change in value with respect to the second of the data points relative to at least two data points adjacent to the second of the data points in the series, the at least two adjacent data points including an immediately preceding and an immediately succeeding one of the data points relative to the second of the data points;
   said controller comparing the first cumulative change and the second cumulative change to respective data thresholds; and
   said controller outputting a filtered analog signal based, at least in part, on results of the comparing.

14. The method of claim 13, wherein outputting the filtered analog signal comprises maintaining a previous value on the filtered analog signal responsive to at least one of the first cumulative change and the second cumulative change failing to correspond to the respective data thresholds.

15. The method of claim 14, wherein the data thresholds are dynamically set based, at least in part, on predetermined values of the data points.

16. A system for filtering an analog signal corresponding to a parameter comprising:
   a signal processor operative to:
   receive information corresponding to samples of the analog signal;
   determine a first cumulative change in value of the parameter with respect to consecutive pairs of the samples of the parameter, a first of the pairs of the samples comprising, in time-sampled order, a first previous value and a second previous value, a second of the pairs of the samples comprising the first previous value and a current value;
   determine a second cumulative change in value of the parameter with respect to the first of the pairs of the samples and a third of the pairs of the samples, the third of the pairs of samples comprising the second previous value and the current value; and
   control output of a filtered analog signal corresponding to the parameter, an analog value being carried by the filtered analog signal being selected based, at least in part, on comparison of the first cumulative change and the second cumulative change to respective predetermined out-of-bound limits such that, responsive to at least one of the first cumulative change and the second cumulative change being outside the respective predetermined out-of-bounds limits, the information being carried by the filtered analog signal is maintained at a previous analog value.

17. The system of claim 16, further comprising a sensor operative to obtain information corresponding to the parameter.

18. The system of claim 17, wherein the sensor is a speed sensor.

19. The system of claim 17, wherein the sensor is a temperature sensor.

20. The system of claim 17, further comprising an analog-to-digital converter operative to receive an analog signal from the sensor and to provide a corresponding digital signal, containing the information corresponding to the samples, to the signal processor.

* * * * *